US009419319B1

(12) United States Patent
Wollack et al.

(10) Patent No.: US 9,419,319 B1
(45) Date of Patent: Aug. 16, 2016

(54) PHOTONIC WAVEGUIDE CHOKE JOINT WITH ABSORPTIVE LOADING

(71) Applicants: Edward J. Wollack, Glenn Dale, MD (US); Kongpop U-Yen, Arlington, VA (US); David T. Chuss, Bowie, MD (US)

(72) Inventors: Edward J. Wollack, Glenn Dale, MD (US); Kongpop U-Yen, Arlington, VA (US); David T. Chuss, Bowie, MD (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 14/501,439

(22) Filed: Sep. 30, 2014

(51) Int. Cl.
*H01P 1/20* (2006.01)
*H05K 1/02* (2006.01)

(52) U.S. Cl.
CPC .................................... *H01P 1/2005* (2013.01)

(58) Field of Classification Search
CPC ........ H01P 1/2005; H01P 1/20; H01P 1/0236
USPC .......................................................... 333/251
See application file for complete search history.

(56) References Cited

U.S. PATENT DOCUMENTS 8,433,170 B2 * 4/2013 Cooke ..................... G02F 1/353 385/129
8,514,036 B2 * 8/2013 McKinzie, III ........... H01P 1/16 333/175
8,693,828 B2 * 4/2014 Wollack .................... H01P 1/00 385/50
2009/0217977 A1 * 9/2009 Florescu ........... H01L 31/02322 136/256

* cited by examiner

*Primary Examiner* — Dean Takaoka
*Assistant Examiner* — Alan Wong

(57) ABSTRACT

A photonic waveguide choke includes a first waveguide flange member having periodic metal tiling pillars, a dissipative dielectric material positioned within an area between the periodic metal tiling pillars and a second waveguide flange member disposed to be coupled with the first waveguide flange member and in spaced-apart relationship separated by a gap. The first waveguide flange member has a substantially smooth surface, and the second waveguide flange member has an array of two-dimensional pillar structures formed therein.

18 Claims, 10 Drawing Sheets

PHOTONIC WAVEGUIDE CHOKE JOINT WITH ABSORPTIVE LOADING

ORIGIN OF THE INVENTION

The invention described herein was made by an employee of the United States Government and may be manufactured and used by or for the Government of the United States of America for governmental purposes without the payment of any royalties thereon or therefor.

BACKGROUND

1. Technical Field

The present disclosure relates to a flat metalized surface waveguide flange having a periodic metal tiling coated with a dissipative dielectric material.

2. Introduction

Typical non-contacting waveguide flange joints produce radiation leakage to the surrounding environments at both in-band frequencies and out-of-band frequencies of the waveguide. The leakage can be significant and interfere with external circuitry, especially in a low noise detector system, if not properly terminated. A unique problem is controlling out-of-band radiation without degrading the in-band response of the waveguide flange. What is needed is a simple structure to fabricate that has good performance with respect to controlling out-of-band radiation over broad range of frequencies.

SUMMARY

Additional features and advantages of the disclosure will be set forth in the description, which follows, and in part will be obvious from the description, or can be learned by practice of the herein disclosed principles. The features and advantages of the disclosure can be realized and obtained by means of the instruments and combinations particularly pointed out in the appended claims. The features of the disclosure will become more fully apparent from the following description and appended claims, or can be learned by the practice of the principles set forth herein.

To address the issues raised above, the present disclosure presents a photonic waveguide choke joint designed as a low-loss non-contact waveguide interface with out-of-band radiation leakage suppression capability. The waveguide can also be used for loss measurement of a flat surface at microwave and mm-wave frequencies or in providing thermal isolation between waveguide structures and their environment. The design consists of a flat metalized surface waveguide flange that can be attached to either a standard or dual polarization guide. The flange contains periodic metal tiling coated with dissipative dielectric material. For in-band operation, the waveguide photonic choke structure contains periodic metal posts and behaves as a highly reflective filter for the plane wave traveling inside the flange. Due to its high reflectivity, the structure directs the plane wave energy back to the waveguide. Out of band radiation is absorbed in the structure by a lossy dielectric material.

DETAILED DESCRIPTION

Figure 1B:
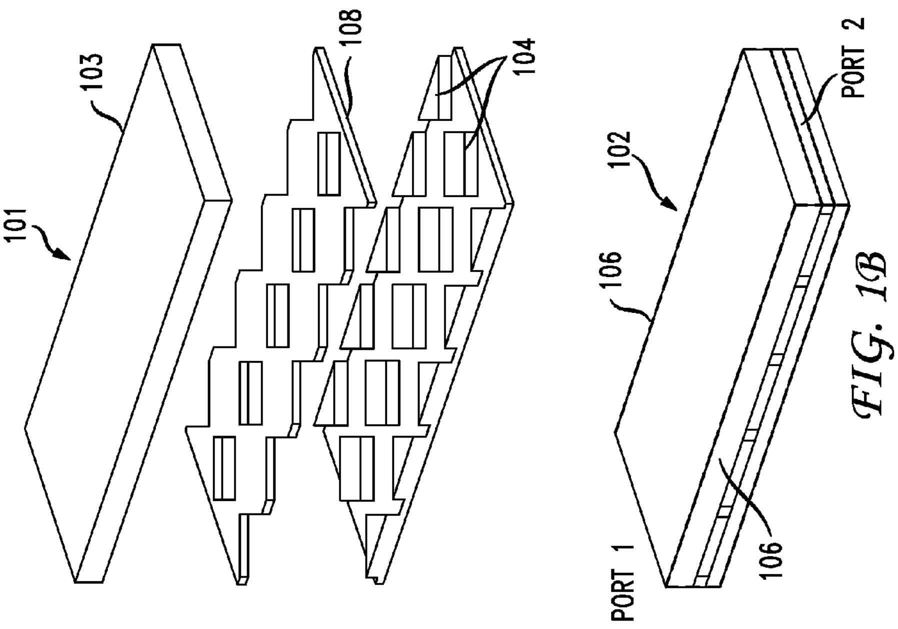
FIG. 1B illustrates an example finite-element electromagnetic model of an infinitely wide photonic choke structure with dielectric material.

Various embodiments of the disclosure are described in detail below. While specific implementations are described, it should be understood that this is done for illustration purposes only. Other components and configurations may be used without parting from the spirit and scope of the disclosure.

The disclosure presents a low-loss non-contact waveguide interface with out-of-band radiation leakage suppression capability. The waveguide interface is designed to be used as part of the low noise cryogenic detector package. The waveguide interface can be used in its pass-band for loss measurement of a flat surface at microwave and mm-wave frequencies.

Photonic choke joint (PCJ) waveguide structures can be used in microwave device and component packaging. The flange interface configuration enables the realization of a high performance non-contacting waveguide joint without degrading the in-band signal propagation properties. The PCJ maintains high thermal/electrical isolation and can be used to define a volume suitable for mounting microwave components. Near ideal transmission and reflection performance over a full-waveguide-band is possible with the approach due to a broad stop-band defined in the interface by a geometric tiling of metallic pillars. Outside the defined stop-band, the PCJ interface is multi-moded and as a result precise control over the device's response in the frequency range is typically limited in such a realization.

For extremely broadband and sensitive packaged high frequency devices control over the out-of-band response is an important consideration for reaching fundamental performance limits. In general, the out-of-band response has two parts: a component that results from direct propagation down single-mode guiding structures and an indirect radiative coupling to the environment. Both of the terms related to direct propagation and indirect radiative coupling should be addressed in a broadband packaging implementation at microwave frequencies. The response in a single-mode guiding structure is commonly defined by passive and active filter elements. The radiative component, on the other hand, is inherently three-dimensional in nature and typically multi-moded.

Enhanced control over the radiative component is possible via the enclosure geometry (e.g., limiting the accessible modes through the use of field confinement) and its material properties (e.g., through the use of absorptive coatings). Previous waveguide PCJ's employ high conductivity metallic structures. As a result, the PJC response has sub-dominate ohmic losses, low emission, and relatively high out-of-band leakage. Through the appropriate introduction of lossy dielectric structures in the space between the PCJ pillars, the structure disclosed herein enables maintenance of a low-loss stop-band and an increase in the out-of-band attenuation. By using a loaded dielectric mixture, the loss can be tailored in a manner that increases as a function of frequency in the far infrared spectrum. Alternatively, if attenuation is only required in the mid infrared spectrum, and shortward in wavelength, other absorbing materials can be applied as conversion coatings or paints. A resulting waveguide interface according to the disclosure is a Loaded Photonic Choke Joint (LPCJ).

Two LPJC implementation examples for use in standard or dual-polarized waveguide or E- and H-plane split-block packaging application are disclosed. The first, with higher performance, requires control over the lossy dielectric and metallic pillar heights. The second, possessing slightly lower rejection but is easier to achieve in practice, has the lossy dielectric layer in the same plane as the metallic pillars. Both implementations can directly replace a PCJ with equivalent loss, greater isolation, and bandwidth.

To develop the waveguide photonic choke joint with the extended out-of-band rejection, the surface wave traveling in an infinite tiling of metallic pillars was investigated. The radiation leakage was studied both in-band and out-of-band frequencies. A plane wave is excited in the model to simplify the simulation process as well as to understand how a plane wave behaves in a periodic structure with an absorptive dielectric. Two types of photonic structures are disclosed. One is with partially-filled dielectric and the other is with a fully-filled dielectric. Finally, the preferable dimensions of pillars are disclosed and applied in the construction of the waveguide PCJs.

The first embodiment to be disclosed is a photonic choke with partially-filled dielectric. Structures related to in-band pillar 104 dimensions optimization are also disclosed. To study the blue leak characteristic in a waveguide photonic choke, a simple periodic metal tiling structure in a finite-element electromagnetic simulation software was constructed as shown as feature 100 in FIG. 1A. The model represents vacuum area where the surface of the metallic structures are made of perfect electric boundaries. Two wave excitation ports are setup at two opposite sides of the wall, whereas perfect magnetic wall 102 is set up on the other sides. The waveguide structure is tuned such that both ports appear highly reflective in the single-mode operation at Q-band (between 30 and 45 GHz).

Figure 1A:
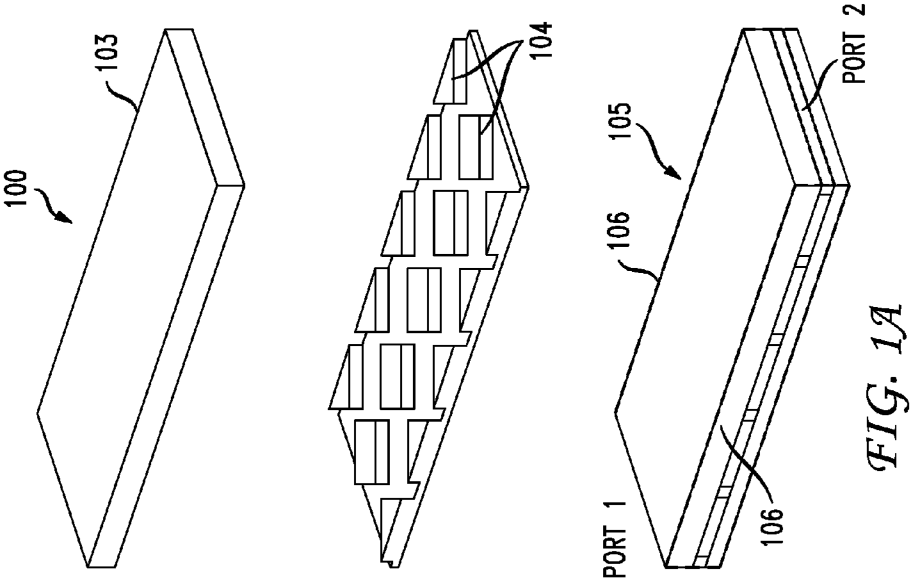
FIG. 1A illustrates an example finite-element electromagnetic model of an infinitely wide photonic choke structure without dielectric material.

FIG. 1A illustrates the structure 100 of the waveguide of a flat metalized surface waveguide flange in a disassembled unit cell model state on top as well as an assembled unit cell model 105 below and without the absorptive loading dielectric material. The perfect magnetic walls 106 are shown as well. The waveguide flange can be either standard or dual polarization. Shown in FIG. 1B is unit cell model of the photonoic choke joint 101 with the absorptive loading dielectric material in both a disassembled state and an assembled state 102 with a perfect magnetic wall 106. The flange contains periodic metal tiling coated with dissipative dielectric material 108. For in-band operation, the waveguide photonic choke structure containing periodic metal posts 104 behaves as a highly reflective filter for the plane wave traveling inside the flange. Due to its high reflectivity, the structure directs the plane wave energy back to the waveguide. The lossy dielectric material 108 (shown in FIG. 1B) filled at the bottom of the metallic posts 104 produces insignificant loss to the in-band response. The thickness of the dielectric can be tuned to dissipate minimum power in the operating frequency bandwidth. In the out-of-band response, the wave inside the photonic choke structure propagates more into the lossy dielectric material 108 producing power dissipation. The power dissipation becomes higher as a function of frequencies as more signal propagates into the lossy dielectric per wavelength.

The structure 102 can be used as part of a low noise detector package or for substrate characterizations. To operate the invention as part of a sensor package, the photonic choke structure can be brought in a very close proximity (25-100 μm) and parallel to the surface if thermal break is required between two components. It is assumed that the dielectric used in microwave circuit operation of the chip is thin compared to the spacing between the chip and the photonic choke's top surface. If no planar circuit is present in the flange, the photonic choke structure can be in close contact with the device under test. For substrate characterization applications, the waveguide flange will be in contact with the material to minimize contact spacing error and leakage.

The metal posts 104 are arranged in a periodic tiling configuration to produce a band-rejecting filter structure for plane wave. The dimensions and spacing of the posts are tuned to provide maximum rejection (or a realistic amount of increased rejection) in the waveguide single-mode operation band. The dissipative dielectric is inserted among posts to reject out-of-band signal. Any of the various dimensions of the size and spacing of the posts 104 disclosed herein can be varied by 20-50% and are exemplary only. In the in-band operation, the dissipative dielectric 108 has insignificant effect on the loss of the structure as the spacing among pillars 104 is small compared to the wavelength. In the out-of-band operation, more wave propagates into the dielectric material and causes the signal to attenuate.

The structure can be operated in a single-mode excitation in the waveguide for minimum loss or a realistic reduction in loss. The structure can be scaled to support any waveguide band. However the scaling for use at high frequency can be limited by the ability for the fabrication process to control tolerances. The spacing between the waveguide photonic choke structure and the device under test should be lower than 75 μm above 30 GHz to avoid in-band radiation leakage. To operate the device, a vector network analyzer or other means of transmitting or receiving power in and out of the waveguide photonic choke structure is required. Calibration standard may be used as a reference for material characterization applications.

Figure 2:
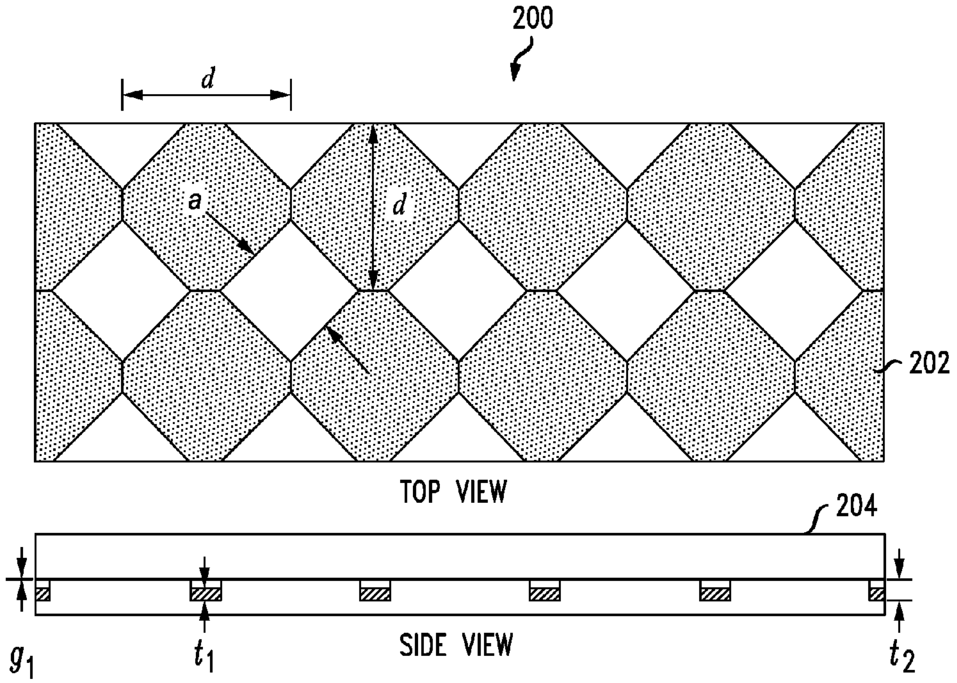
FIG. 2 illustrates a top view and cross sectional view of an example finite-element electromagnetic model of an infinitely wide photonic choke structure with dielectric material and optimized pillar height.

When dissipative dielectric material (with a dielectric constant of $e_r$=9−2j) is inserted on the metal pillar 104 side of the photonic choke structure, between pillars (shown in FIGS. 1B-2), the in-band transmission from port 1 to port 2 is reduced by 16 dB at the center operating frequency of 38 GHz. FIG. 2 shows the photonic choke joint 200 with a top view 202 and a cross sectional view 204 with absorptive dielectric loading material. In this case, the pass-band is between 25 and 45 GHz, d=3.87 mm and a=2.28 mm. The values can vary up or down by 20%.

Figure 3:
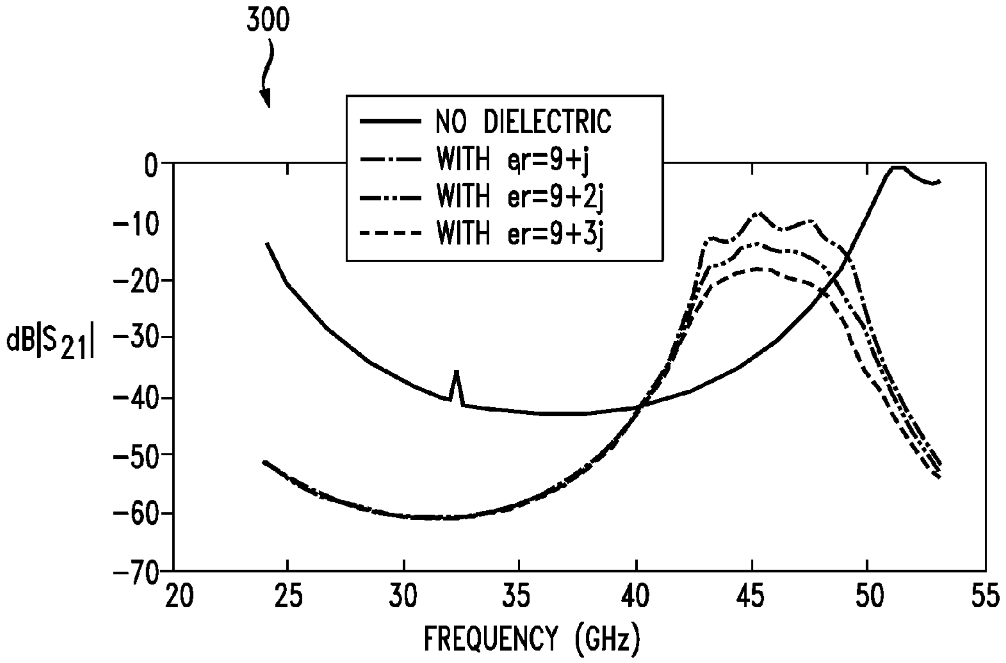
FIG. 3 is a graph of the in-band response of the photonic choke structure with and without a lossy dielectric insert.
Figure 4:
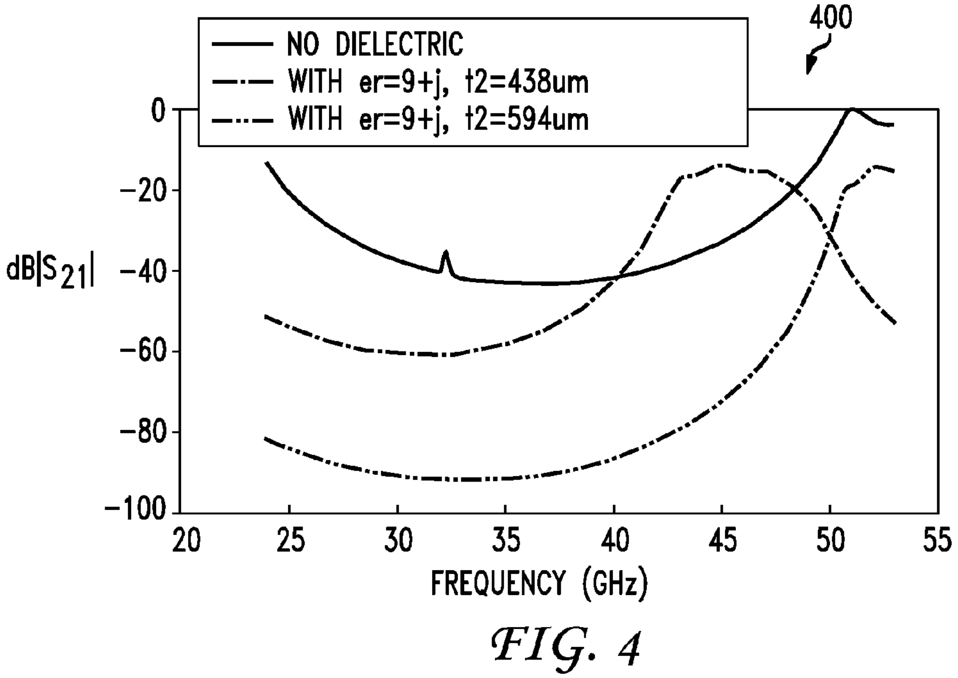
FIG. 4 is a graph of a comparison between the photonic choke with an original pillar height and an optimized pillar height.
Figure 5:
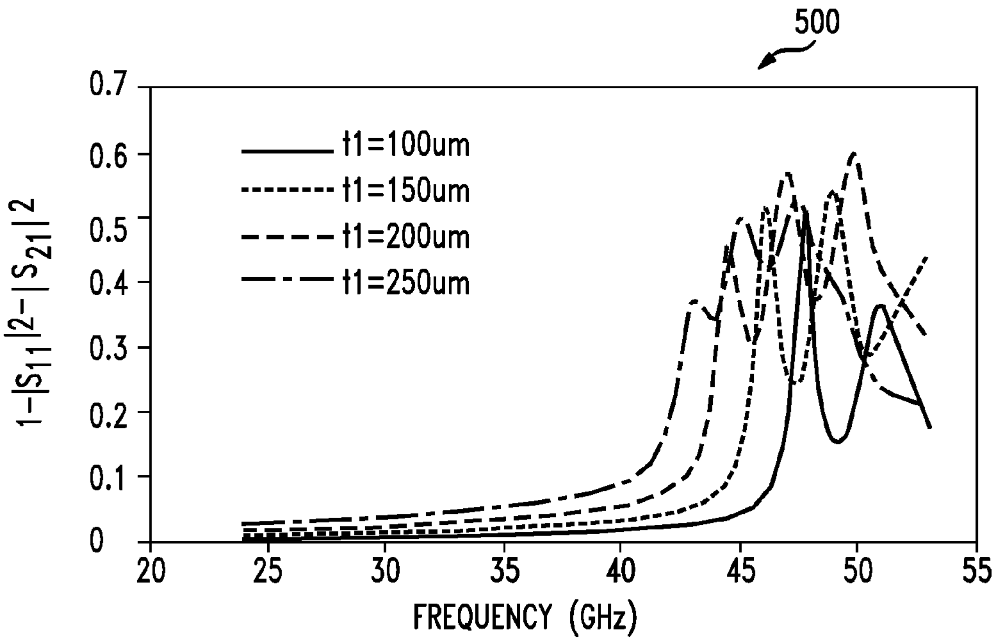
FIG. 5 is a graph of in-band power absorption by the dielectric per unit with various thickness while maintaining $t_1-t_2=188$ μm.

FIG. 1B illustrates the metallic pillar approach with an absorptive loading dielectric insert 108 with a shift in the operating frequency as well as showing a reduction of inband power transmission as shown in the graph 300 of FIG. 3. FIG. 3 shows the in-band response of the photonic choke structure with and without absorptive loading dielectric and with $t_1$=250 μm, $t_2$=438 μm and $g_1$=51 μm. The operating band shift is due to wavelength inside the dielectric being electrically longer than that in the vacuum. To shift in operating frequency back to the original value, the pillar height, can be adjusted higher, thus improving the ability for the photonic choke joint to reflect power in the operating frequency band as shown in the graph 400 of FIG. 4. FIG. 4 shows a comparison between a photonic choke with an original (438 μm) pillar height and an adjusted height (594 μm) for low loss in-band response. The absorptive loading thickness is 250 μm and $g_1$=51 μm. Variations on the values are also contemplated to be around plus or minus 20%. The power dissipated in the operating band is lower than 4.5% as is shown in the graph 500 of FIG. 5. FIG. 5 shows the simulated power absorbed by five sections of pillar unit. The in-band response of the photonic choke structure is shown with $t_1$ of 100, 150, 200 and 250 μm, $g_1$=51 μm while maintaining the value $t_1$-$t_2$ of 188 μm.

The following are some example relationships between the heights of the absorptive dielectric height ($t_1$) while maintaining the metal pillar height above the dielectric ($t_1$-$t_2$) of 188 μm. A thickness of the dissipative dielectric material can be tuned based on an amount of power that is to be dissipated in an operating frequency bandwidth.

Optimally, a height of each pillar of the periodic structure is approximately three times a height of the dissipative dielectric material when the dissipative dielectric material has a relative dielectric constant of 9.

Figure 6:
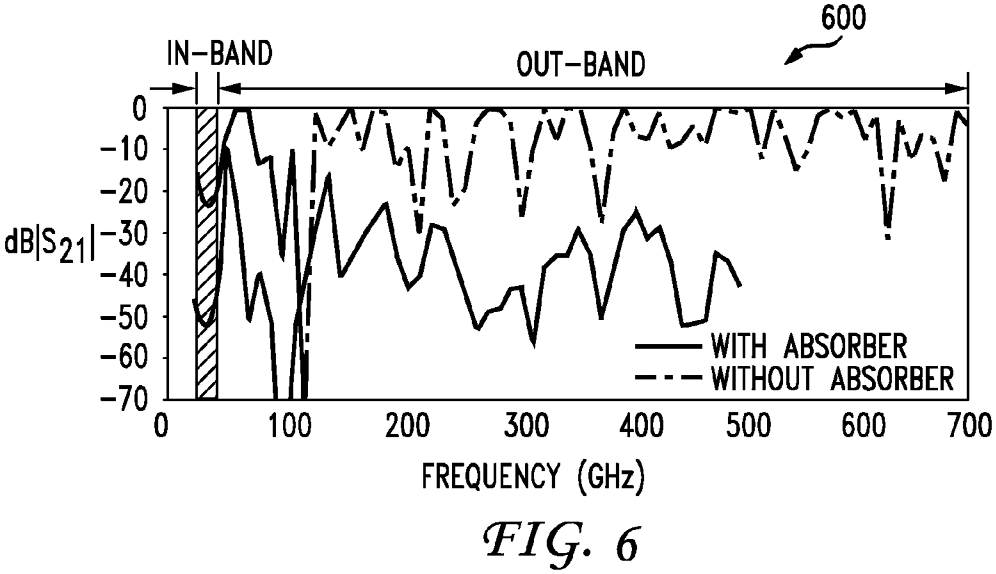
FIG. 6 is a graph of a broadband photonic choke response up to 700 GHz with and without the absorber placed around the metallic pillars.

Next is discussed the broadband performance of the loaded photonic choke structure. At the frequency above the operating band, the plane wave becomes more scattered as frequency increases. Thus, more signal propagates inside the dissipative dielectric area. As a result, the structure disclosed herein produced a significant attenuation out of band in comparison to the same structure in a vacuum alone as shown in the graph 600 of FIG. 6. FIG. 6 illustrates a simulated broadband photonic choke response up to 700 GHz with and without the absorber placed around the metallic pillars for $t_1$=250 μm, $g_1$=50 μm and $t_2$=438 μm.

Figure 7:
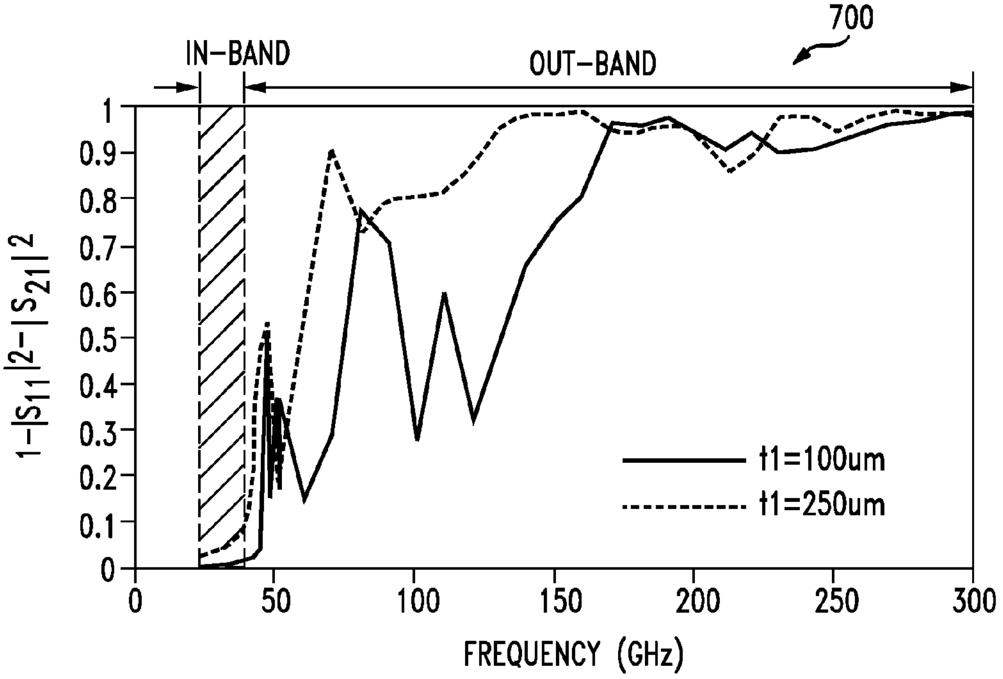
FIG. 7 is a graph of the total power absorbed with the dielectric with dielectric constant, $e_r=9-2j$, and $t_1=100$ and 250 μm and $g_1=50$ μm.

By computing the total loss obtained from the simulation using the equation $1-|S_{11}|^2-|S_{21}|^2$, more than 60% of the power absorbed in the dielectric above 150 GHz as shown in the graph 700 of FIG. 7. FIG. 7 shows the total power absorbed with the dielectric with $e_r$=9−2i and with the dielectric thickness of 100 and 250 μm. The power dissipation approach 100% as frequency increases above 300 GHz. In FIG. 7, $g_1$=51 μm and the value $t_1$−$t_2$ of 188 μm is maintained.

Next is disclosed a photonic choke with a filled-dielectric where $t_1$=$t_2$. The photonic choke structure can be redesigned with the dissipative dielectric 108 filling the entire area up to the pillar height as shown in the waveguide of FIG. 1B. The dimension of the pillar is optimized or chosen for minimum or low power transfer between port 1 and port 2, similar to the first approach disclosed above. The vacuum gap is set at 50 μm or lower to reduce the overall power leakage.

Figure 8:
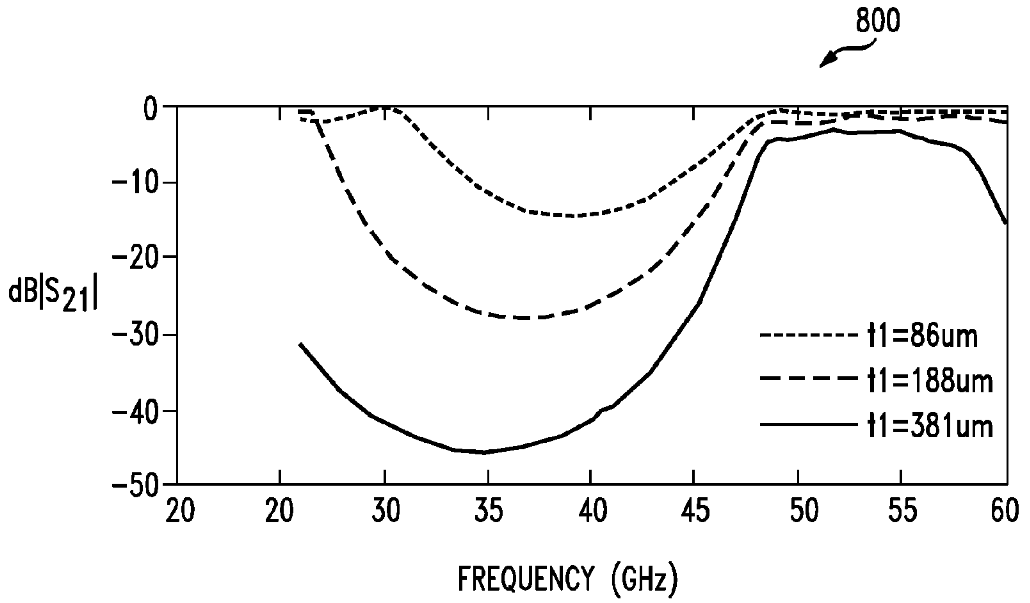
FIG. 8 is a graph of the frequency response of the dielectric filled photonic choke with a variable height and with $e_r=3-0.1j$ for five square cells long structure.

By increasing the pillar height, the isolation between port 1 and port 2 increases as shown in the power transmission response ($|S_{21}|$) in the graph 800 of FIG. 8 for the dielectric-filled photonic choke with $\in_r$=3−0.1j.

Figure 9:
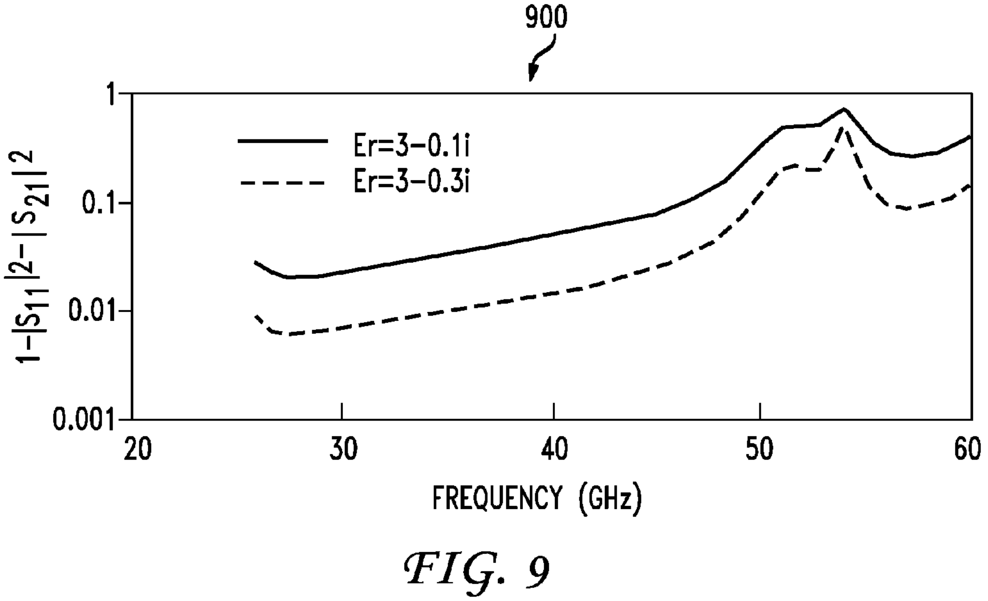
FIG. 9 is a graph of the in-band response of the dielectric filled photonic choke with dielectric constant of 3−0.1j and 3−0.03j for three square cells long structure.

Since the total loss in the proposed structure is highly dependent on the loss tangent of the dielectric material as shown in the graph 900 of FIG. 9. It is necessary to select the dielectric with loss low enough to generate small in-band power dissipation. FIG. 9 is the in-band response of the dielectric filled photonic choke with dielectric constant of 3−0.1j and 3−0.03j.

Figure 10:
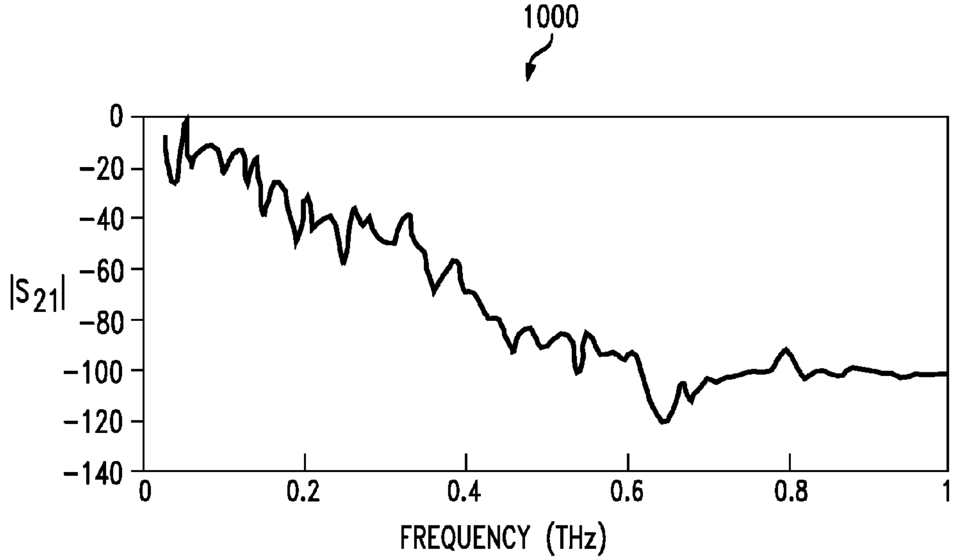
FIG. 10 is a graph of the frequency response of a signal of the dielectric-filled photonic choke with $e_r=3-0.1j$ for three square cells long structure.
Figure 11:
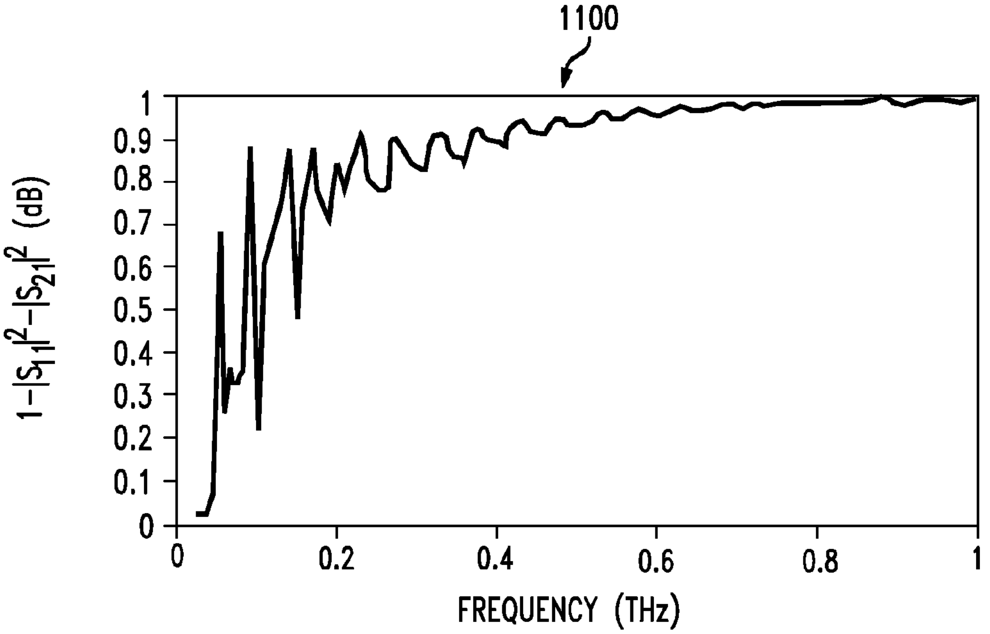
FIG. 11 is a graph of the total power absorbed with the dielectric for $e_r=3-0.1j$.
Figure 12:
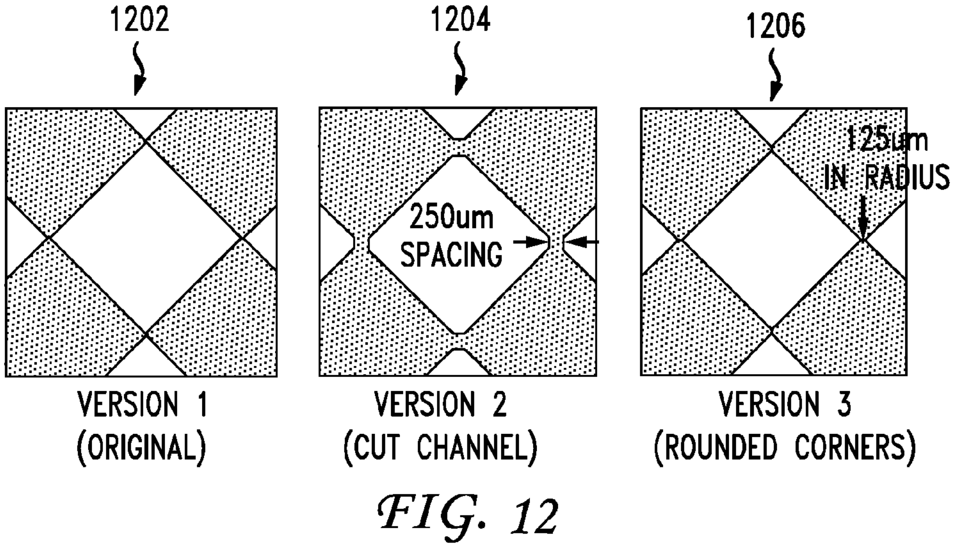
FIG. 12 illustrates the top view of the photonic choke with square pillar shape and a cut channel pillar shape and a rounded corner pillar shape.

In the out-of-band operation, the attenuation of the structure increases with frequencies and becomes significantly high (40 dB) above 300 GHz as show in graph 1000 of FIG. 10. FIG. 10 illustrates the frequency response of $S_{21}$ of the dielectric-filled photonic choke with $e_r$=3−0.1j. At frequencies above 300 GHz, more than 80% of power is absorbed in the dielectric (see graph 1100 of FIG. 11). FIG. 12 illustrates the total power absorbed in the dielectric (i.e., $1-|S_{11}|^2-|S_{21}|^2$ for $e_r$=3−0.1j) and $t_1$=381 μm.

When the photonic choke is fabricated using a machine such as a computer numeric control (CNC) machine by removing conductive material to form pillar structures, a few limitations occur due to the end-mil size that can be used to make the structure where two metallic pillars have a spacing of a less than 250 μm. An example of the photonic choke structure for waveguide operation between 30 and 45 GHz is the pillar spacing of 81 and 381 μm deep. This is difficult to fabricate using 50 μm end mil as the end mil cannot reach a deep pocket due to the width-to-height ratio of the removed material. Therefore, three possible fabrication versions with respect to different pillar designs are proposed as shown in a square version 1 (1202), cut channel version 2 (1204) and rounded corners version 3 (1206) shown in FIG. 12 by using the end-mil with 250 μm of diameter. The device can also be realized by other means (e.g., extrusion, additive manufacturing, chemical milling or micromachining, etc. depending upon the feature sizes to be realized). Of course other shapes are also contemplated for the pillar designs such as round, elliptical, rectangular, triangular, arbitrary, pentagonal, etc. Any shape can be used for the pillars and the spacing between the pillars.

Figure 13:
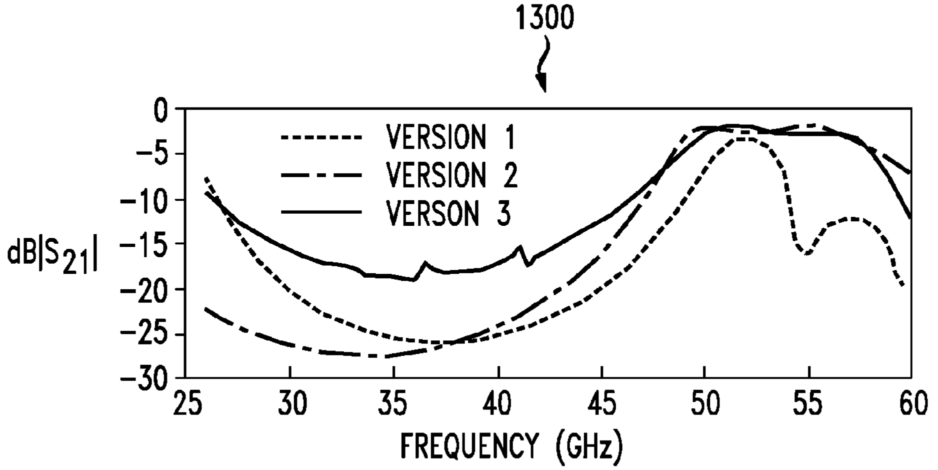
FIG. 13 is a graph of the in-band frequency response of the photonic choke with three square cells long structure.

The simulation results show that the photonic choke version 2 produces a comparable response to the original design 1202 as shown in the graph 1300 of FIG. 13 and version 2 is selected as the most suitable approach for fabrication using a CNC machine. FIG. 13 also shows the in-band frequency response of the photonic choke versions 1, 2 and 3.

Figure 14:
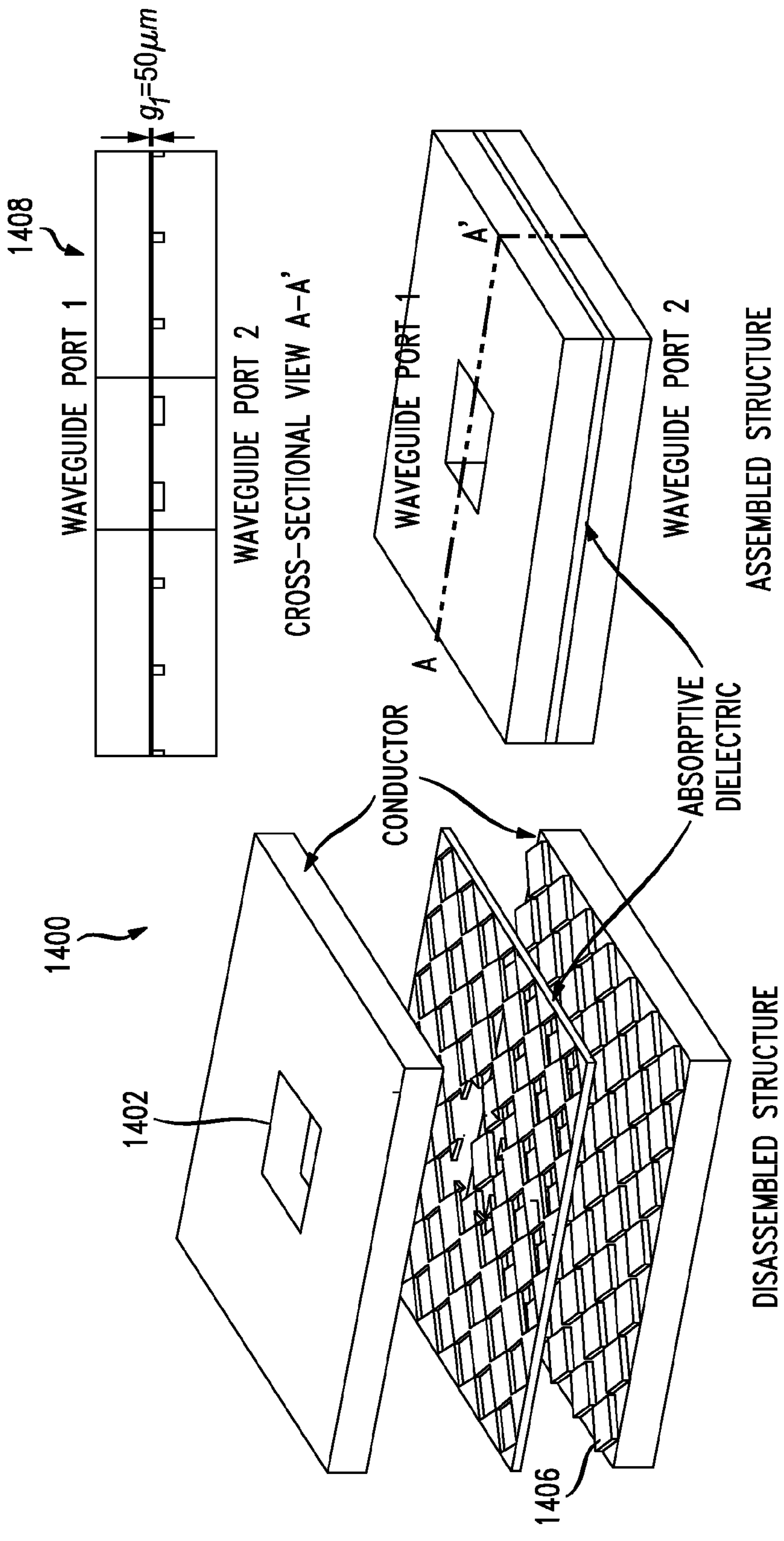
FIG. 14 is a 3D view of the square waveguide choke flange.

Next is disclosed a square waveguide implementation using photonic choke filled with dissipative dielectric and a 2-port model. To implement the photonic choke tiling in a square waveguide flange, the tiling structure is placed on the flat surface of the square waveguide flange as shown in the model in an original choke version in FIG. 14. FIG. 14 shows 1400 a 3D view of the square waveguide photonic choke flange with a dielectric of $e_r$=3−0.1j, the waveguide 1402, and a metallic pillar 1406. Example heights and separations between pillars are shown in FIG. 14 for illustration purposes only. The height could be anywhere between 50 and 75 microns and the width between pillars could be anywhere between 50 and 500 microns.

FIG. 14 also illustrates a cross-sectional view 1408 of the waveguide flange with the dielectric material. The square waveguide 1402 is shown with a 50 μm vacuum gap and a height of 381 μm.

Figure 15:
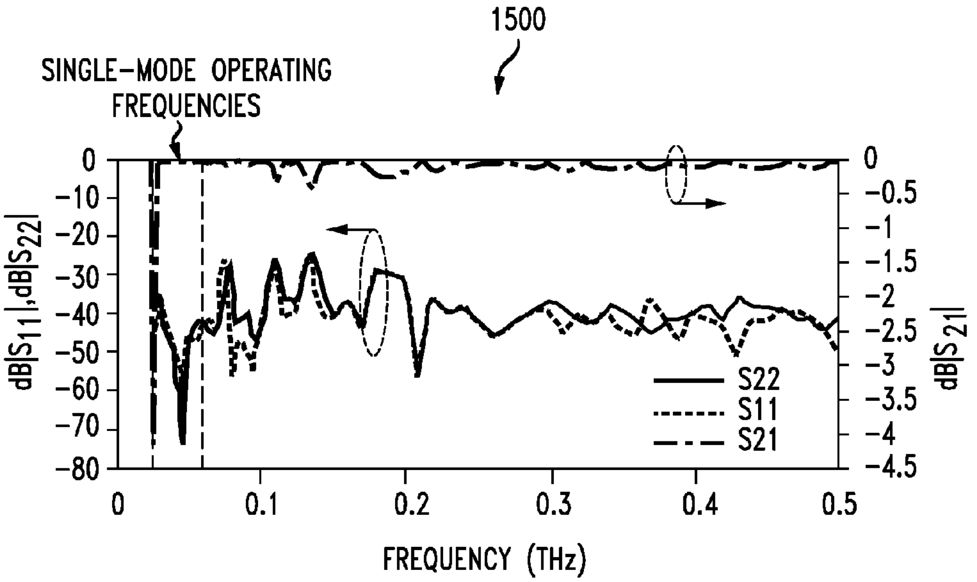
FIG. 15 is a graph of simulated scattering parameters, S, of the waveguide photonic choke.

A 50 micron vacuum spacing is placed between one flange and the other. The power leakage was tested by applying power to waveguide port 1 and receiving power in port 2. Each pillar will be separated by 250 μm gap to be compatible with the end-mill diameter/cut length ratio of ⅔ or approximately thereof. The total power absorbed in the dielectric is ~3% out of band while most of the power is transmitted from port 1 to port 2. The return loss of the waveguide flange with loaded PCJ is better than 30 dB. Graph 1500 in FIG. 15 shows a simulated S parameter of the waveguide photonic choke. Small amount of transmission loss was observed outside the operating band due to the absorption in photonic choke structure.

To address the issues raised above, the present disclosure presents a photonic waveguide choke joint designed as a low-loss non-contact waveguide interface with out-of-band radiation leakage suppression capability. The waveguide can also be used for loss measurement of a flat surface at microwave and mm-wave frequencies or in providing thermal isolation between waveguide structures and their environment. The design consists of a flat metalized surface waveguide flange that can be attached to either a standard or dual polarization guide. The flange contains periodic metal tiling coated with dissipative dielectric material. For in-band operation, the waveguide photonic choke structure contains periodic metal posts that behave as a highly reflective filter for the plane wave traveling inside the flange. Due to its high reflectivity, the structure directs the plane wave energy back to the waveguide.

There are advantages to the structure disclosed herein. The structure is simple to fabricate and has good performance over broad temperature ranges and can be scaled to support any waveguide band. The low-loss waveguide flange that has an ability to suppress out-of-band leakage over a broad bandwidth for bolometric detector applications.

Another embodiment of the disclosure relates to a method of operating a waveguide in which the waveguide has any structure as disclosed herein. For example, a method of operating a waveguide can include receiving an input wave into the waveguide and suppressing out-of-band leakage according to a structure of the waveguide, wherein the structure of the waveguide includes a first waveguide flange member having periodic tiling pillars that can be metal, dissipative dielectric material positioned within an area between the tiling pillars and a second waveguide flange member disposed to be coupled with the first waveguide flange member and in spaced-apart relationship separated by a gap. The first waveguide flange member can have a substantially smooth surface, and the second waveguide flange member can have an array of two-dimensional pillar structures formed therein.

The various embodiments described above are provided by way of illustration only and should not be construed to limit the scope of the disclosure. For example, the principles herein can be varied and extend beyond given distances or heights as described. Various modifications and changes may be made to the principles described herein without following the example embodiments and applications illustrated and described herein, and without departing from the spirit and scope of the disclosure. Claim language reciting "at least one of" a set indicates that one member of the set or multiple members of the set satisfy the claim.

We claim:

1. A photonic waveguide choke, the photonic waveguide choke comprising:
- a first waveguide flange member having periodic metal tiling pillars;
- a dissipative dielectric material positioned within an area between the periodic metal tiling pillars; and
- a second waveguide flange member disposed to be coupled with the first waveguide flange member and in spaced-apart relationship separated by a gap, the first waveguide flange member having an array of two-dimensional pillar structures formed therein, and the second waveguide flange member having a substantially smooth surface,
- wherein the dissipative dielectric material has a dielectric constant between 9−j and 9−3j.

2. The photonic waveguide choke of claim 1, where a thickness of the dissipative dielectric material is tuned based on an amount of power that is to be dissipated in an operating frequency bandwidth.

3. The photonic waveguide choke of claim 1, wherein a pillar height of the periodic metal tiling pillars is between 150 and 700 μm.

4. The photonic waveguide choke of claim 1, wherein a thickness of the dissipative dielectric material is between 200 and 300 μm.

5. The photonic waveguide choke of claim 1, wherein a height of each pillar of the periodic metal tiling pillars is double a height of the dissipative dielectric material.

6. The photonic waveguide choke of claim 1, wherein a height of each pillar of the periodic metal tiling pillars is, within a range of 200 μm, three times a height of the dissipative dielectric material.

7. The photonic waveguide choke of claim 1, wherein a height of each pillar of the periodic metal tiling pillars is greater than a height of the dissipative dielectric material.

8. The photonic waveguide choke of claim 1, wherein a height of each pillar of the periodic metal tiling pillars is equal, within 20 μm, to a height of the dissipative dielectric material.

9. The photonic waveguide choke of claim 1, wherein a spacing between each pillar of the periodic metal tiling pillars is less than 300 μm.

10. The photonic waveguide choke of claim 1, wherein each pillar of the periodic metal tiling pillars is generally square shaped and each corner of the each pillar is one of sharp-edged and rounded-edged.

11. The photonic waveguide choke of claim 10, wherein when an edge of the each corner is rounded-edged, a radius of each rounded-edged corner is between 100 and 300 μm.

12. A method of operating a waveguide, the method comprising:
- receiving an input wave into the waveguide; and
- suppressing out-of-band leakage according to a structure of the waveguide, wherein the structure of the waveguide comprises:
  - a first waveguide flange member having periodic metal tiling pillars;
  - a dissipative dielectric material positioned within an area between the periodic metal tiling pillars; and
  - a second waveguide flange member disposed to be coupled with the first waveguide flange member and in spaced-apart relationship separated by a gap, the first waveguide flange member having an array of two-dimensional pillar structures formed therein, and the second waveguide flange member having a substantially smooth surface, wherein the dissipative dielectric material has a dielectric constant between 9−j and 9−3j.

13. The method of claim 12, where a thickness of the dissipative dielectric material is tuned based on an amount of power that is to be dissipated in an operating frequency bandwidth.

14. The method of claim 12, wherein a pillar height of the periodic metal tiling pillars is between 150 and 700 μm.

15. The method of claim 12, wherein a thickness of the dissipative dielectric material is between 200 and 300 μm.

16. The method of claim 12, wherein a height of each pillar of the periodic metal tiling pillars is double a height of the dissipative dielectric material.

17. The method of claim 12, wherein a height of each pillar of the periodic metal tiling pillars is, within a range of 200 μm, three times a height of the dissipative dielectric material.

18. The method of claim 12, wherein a height of each pillar of the periodic metal tiling pillars is greater than a height of the dissipative dielectric material.

* * * * *